(12) United States Patent
Chung (10) Patent No.: US 10,615,008 B2
(45) Date of Patent: Apr. 7, 2020

(54) TEMPERATURE CONTROL METHOD

(71) Applicant: Tokyo Electron Limited, Tokyo (JP)

(72) Inventor: Jun Young Chung, Gyeonggi-do (KR)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/140,745

(22) Filed: Sep. 25, 2018

(65) Prior Publication Data

US 2019/0103255 A1   Apr. 4, 2019

(30) Foreign Application Priority Data

Sep. 29, 2017   (JP) ................... 2017-189621

(51) Int. Cl.
```
H01J 37/32      (2006.01)
H01L 21/67      (2006.01)
H01L 21/683     (2006.01)
H01L 21/3065    (2006.01)
H01L 21/311     (2006.01)
```
(52) U.S. Cl.
CPC .. *H01J 37/32522* (2013.01); *H01J 37/32449* (2013.01); *H01J 37/32834* (2013.01); *H01L 21/3065* (2013.01); *H01L 21/31138* (2013.01); *H01L 21/67069* (2013.01); *H01L 21/67109* (2013.01); *H01L 21/67248* (2013.01); *H01L 21/67253* (2013.01); *H01L 21/6831* (2013.01); *H01L 21/6833* (2013.01); *H01J 2237/3341* (2013.01)

(58) Field of Classification Search
None
See application file for complete search history.

(56) References Cited

U.S. PATENT DOCUMENTS

2008/0102209 A1\* 5/2008 Sasaki ............... H01L 21/67248
427/294
2012/0227955 A1\* 9/2012 Koshimizu ........ G05D 23/1919
165/281

FOREIGN PATENT DOCUMENTS

JP      2017-005128      1/2017

\* cited by examiner

*Primary Examiner* — Jiong-Ping Lu
(74) *Attorney, Agent, or Firm* — IPUSA, PLLC

(57) ABSTRACT

A temperature control method of controlling a temperature of an object to be processed includes supplying a heat-transfer gas between an object to be processed and a mounting stage from a gas port from among a plurality of gas ports provided in a mounting stage, exhausting the heat-transfer gas from another gas port different from the gas port, detecting pressure of the gas port supplying the heat-transfer gas and the another gas port exhausting the heat-transfer gas, and adjusting the pressure.

7 Claims, 12 Drawing Sheets

TEMPERATURE CONTROL METHOD

CROSS-REFERENCE TO RELATED APPLICATIONS

This patent application is based upon and claims the benefit of priority of Japanese Patent Application No. 2017-189621 filed on Sep. 29, 2017, the entire contents of which are incorporated herein by reference.

BACKGROUND OF THE INVENTION

1. Field of the Invention

The present invention relates to a temperature control method.

2. Description of the Related Art

In a plasma processing apparatus such as an etching device, it is important to control the temperature of a substrate in order to obtain good plasma properties such as a good etching rate. Therefore, the inside of a mounting stage mounting the substrate is divided into multiple zones, in which heaters are respectively built in, and the heaters are controlled for each zone to control a temperature distribution on the surface of the mounting stage (for example, Patent Document 1).

The heat-transfer gas diffusion areas are respectively provided in a central portion and a peripheral edge portion on the upper surface of the mounting stage, and the supply pressure of the heat-transfer gas to be supplied to each of the heat-transfer gas diffusion areas is individually adjusted so that the heat-transfer amount from the mounting stage to the substrate on the surface of the mounting stage is controlled.
[Patent Document 1] Japanese Laid-open Patent Publication No. 2017-5128

SUMMARY OF THE INVENTION

A temperature control method of controlling a temperature of an object to be processed includes supplying a heat-transfer gas between an object to be processed and a mounting stage from a gas port from among a plurality of gas ports provided in a mounting stage, exhausting the heat-transfer gas from another gas port different from the gas port, detecting pressure of the gas port supplying the heat-transfer gas and the another gas port exhausting the heat-transfer gas, and adjusting the pressure.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

The method of providing the heat-transfer gas diffusion areas respectively in the central portion and the peripheral edge portion on the upper surface of the mounting stage tends to cause temperature unevenness in the vicinity of a border between the heat-transfer gas diffusion area provided in the central portion and the heat-transfer gas diffusion area provided in the peripheral edge portion.

According to the embodiment of the invention, an object is to provide a temperature control method enabling to enhance the controllability of temperature distribution on the surface of the substrate.

A description of embodiments of the present invention is given below, with reference to the FIG. 1 through FIG. 9B.

The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
10: processing container;
12: mounting stage;
28: exhaust device;
40: electrostatic chuck;
90: heat-transfer gas supply mechanism;
92: heat-transfer gas supply source;
94: heat-transfer gas supply line;
96: heat-transfer gas exhaust line;
97a, 97b: orifice;
h, h1, h2: gas port;
A: heat-transfer gas diffusion area;
P1-P4: pressure gauge;
V1-V4: control valve; and
W: wafer.

[First Embodiment]

Figure 1:
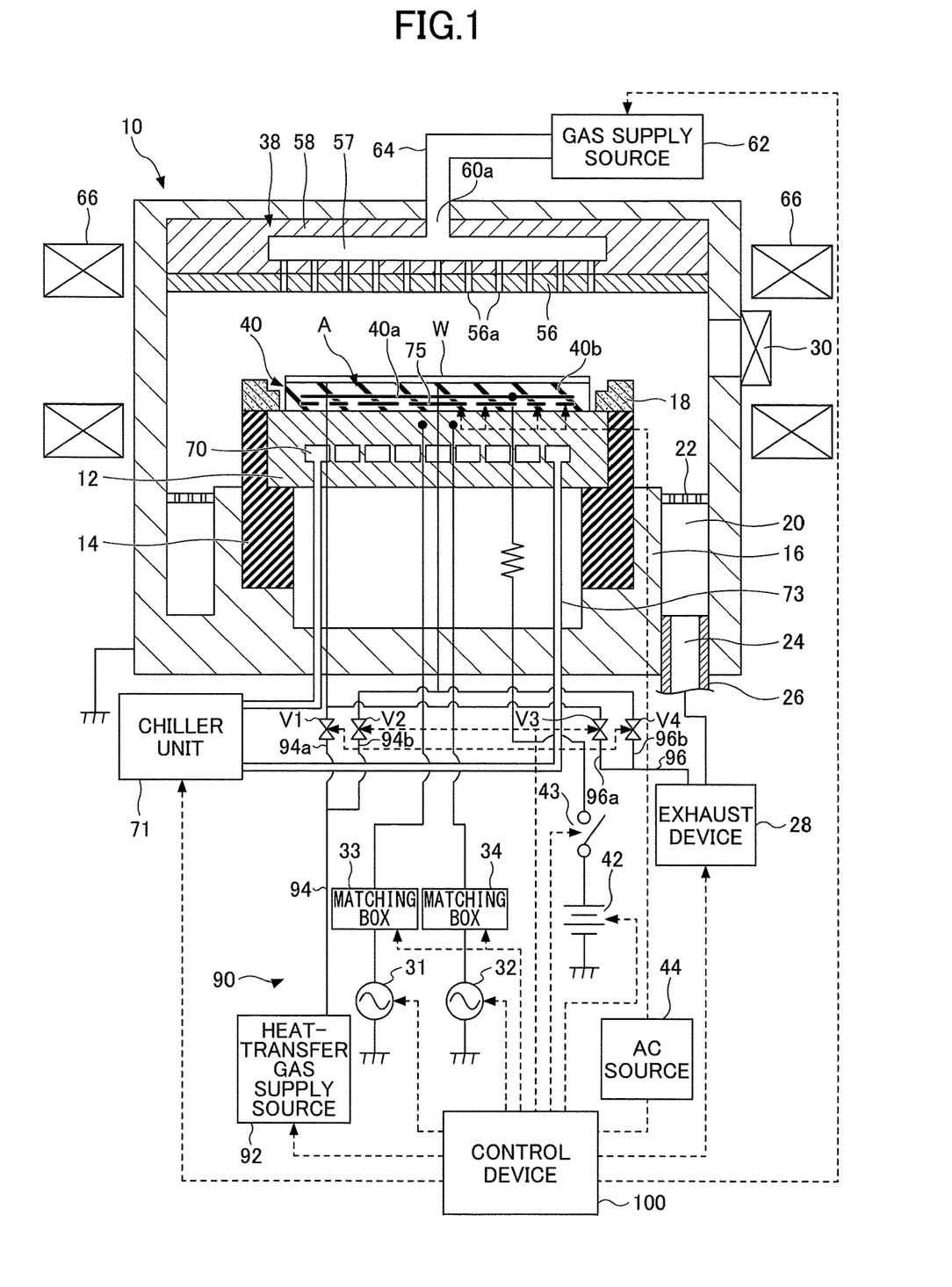
FIG. 1 schematically illustrates a plasma processing apparatus according to a first embodiment.

Described is a plasma processing apparatus according to a first embodiment. FIG. 1 schematically illustrates the plasma processing apparatus according to the first embodiment.

As illustrated in FIG. 1, the plasma processing apparatus is structured to be a capacity-coupled type plasma etching device of a dual-frequency lower electrode type. The plasma processing apparatus has a cylindrical processing container 10 made of aluminum having a surface that is provided with alumite treatment (an anodic oxidation process). The processing container 10 is grounded.

The mounting stage 12 is provided inside the processing container 10. A semiconductor wafer (hereinafter, referred to as a "wafer W") is mounted on the mounting stage 12 as an object to be processed. The mounting stage 12 is formed by a material such as aluminum (Al), titanium (Ti), and silicon carbide (SiC). The mounting stage 12 is supported by a supporting portion 16 through cylindrical retaining portion 14 made of an insulating material. With this, the mounting stage 12 is installed in a bottom portion of the processing container 10.

The exhaust pipe 26 is provided at a bottom portion of the processing container 10. The exhaust pipe 26 is coupled to an exhaust device 28. The exhaust device 28 is formed by a vacuum pump such as a turbo molecular pump and a dry pump. The exhaust device 28 depressurizes a process space inside the processing container 10 so as to be a predetermined degree of vacuum and simultaneously guides a gas inside the processing container 10 into an exhaust passage 20 and an exhaust port 24 so as to be exhausted. A ring-like baffle plate 22 is attached to the exhaust passage 20 to control a gas flow.

A gate valve 3 for carrying the wafer opens or closes a carry-in and carry-out port for the wafer W. The gate valve is attached to the sidewall of the processing container 10.

The first high-frequency power source 31 for exiting plasma is connected to the mounting stage 12 through a matching box 33. The first high-frequency power source 31 applies high-frequency power having a frequency suitable for generating plasma inside the processing container 10, for example, 60 MHz (high-frequency power for plasma excitation) to the mounting stage 12. Further, a second high-frequency power source 32 for leading ions inside plasma into the wafer W is connected to the mounting stage 12 through the matching box 34. The second high-frequency power source 32 applies high-frequency power having a rather low frequency suitable for leading ions inside plasma into the wafer on the mounting stage 12, for example, 0.8 MHz (high-frequency power for leading ions) 32 to the mounting stage 12. As described, the wafer W is mounted on the mounting stage 12 and the mounting stage 12 has a function as the lower electrode.

An electrostatic chuck (ESC) 40 is provided on the upper surface of the mounting stage 12 so as to hold the wafer W using electrostatic adsorption force. The electrostatic chuck 40 is formed by sandwiching an electrode 40a made of conductive film between a pair of insulating layer 40b (or an insulating sheet). A direct voltage source 42 is electrically connected to the electrode 40a through a switch 43. The electrostatic chuck 40 adsorbs the wafer to hold it on the electrostatic chuck 40 by coulomb force generated by voltage from the direct voltage source 42.

A focus ring 18 is arranged in a peripheral edge portion of an electrostatic chuck 40 so as to surround the periphery of the mounting stage 12. The focus ring 18 is made of, for example, silicon and quartz. The focus ring 18 functions to enhance in-plane evenness in etching.

A shower head 38, as an upper electrode having the ground potential, is provided in the ceiling portion of the processing container 10. With this, the high-frequency power output from the first high-frequency power source 31 is applied between the mounting stage 12 and the shower head 38 so as to form a capacitor.

The shower head 38 includes an electrode plate 56 having a great number of gas vents 56a and an electrode supporter 58 attachably and detachably supporting the electrode plate 56. The gas supply source 62 supplies the gas from gas introduction port 60a into the inside of the shower head 38 through a gas supplying pipe 64. The gas is diffused by a gas diffusion chamber 57 and is introduced into the processing container 10 from a great number of gas vents 56a.

Around the processing container 10, a magnet 66 extending in a ring-like shape or a concentric circle shape is arranged to control plasma generated in a plasma generation space inside the processing container 10 by magnetic force.

A refrigerant pipe 70 is provided inside the mounting stage 12. The refrigerant supplied from the chiller unit 71 circulates through a refrigerant pipe 70 and a refrigerant circulation pipe 73 to cool the mounting stage 12. A heater 75 divided into four parts are attached to the electrostatic chuck 40. A desirable alternating-current voltage is applied from the alternating-current source 44 to the heater 75. Thus, the heater 75 heats the electrostatic chuck 40. According to this structure, the wafer W can be adjusted to have a predetermined temperature by cooling by the chiller unit 71 and heating by the heater 75. These temperature controls are conducted based on an instruction from the control device 100.

Heat of the mounting stage 12 adjusted to be a predetermined temperature is transferred to the wafer adsorbed on the upper surface of the electrostatic chuck 40 through the electrostatic chuck 40. At this time, the heat is efficiently transferred to the wafer even though the inside of the processing container 10 is depressurized, the heat-transfer gas supply mechanism 90 supplies a heat-transfer gas such as helium (he) toward the back surface of the wafer W that is adsorbed on the upper surface of the electrostatic chuck 40. Detailed heat-transfer gas supply mechanism 90 is described later.

The control device 100 controls various portions of the plasma processing apparatus. Specifically, the control device 100 controls an exhaust device 28, a first high-frequency power source 31, a second high-frequency power source 32, matching boxes 33 and 34, a 42, a direct voltage source 42, a switch 43, an alternating-current source 44, a gas supply source 62, a chiller unit 71, and a heat-transfer gas supply mechanism 90. Further, the control device 100 is connected also to the host computer (not illustrated).

The control unit 100 includes a central processing unit (CPU), a read only memory (ROM), a random access memory (RAM), and so on (not illustrated). The CPU performs a plasma process in accordance with various recipes stored in, for example, a memory unit. The memory unit storing the recipe can be substantialized as a RAM or a ROM using, for example, a semiconductor memory, a magnetic disk, an optical disk, or the like. The recipe is stored in a recording medium and served, may be read into a memory unit through a driver, or may be downloaded from the network and stored in the memory unit. The function of the control device 100 may be substantialized by causing to be operated using software, or may be substantialized by causing to be operated using software.

When etching is conducted in the plasma processing apparatus having such a structure, the gate valve 30 is opened to carry in the wafer held by the transfer arm into the inside of the processing container 10. The wafer W is held by a lift pin (not illustrated) and is mounted on the electrostatic chuck 40 when the lift pin moves down. After the wafer W is carried in, the gate valve is closed and an etching gas having a predetermined flow rate and a predetermined flow rate is introduced from the gas supply source 62 into the processing container 10, and pressure inside the processing container 10 is depressurized by an exhaust device 28 to be a setup value. Further, high-frequency power having a predetermined output is supplied from the high-frequency power source 31 and the high-frequency power source 32 to the mounting stage 12. Further, a voltage is applied to the electrode 40a of the electrostatic chuck 40 from the direct voltage source 42, and the wafer W is fixed onto the electrostatic chuck 40. The heat-transfer gas is supplied by the heat-transfer gas supply mechanism 90 to the back surface of the wafer W adsorbed on the upper surface of the electrostatic chuck 40. The etching gas introduced like shower from the shower head 38 is converted to plasma by high-frequency power from the first high-frequency power source 31. With this, plasma is generated in a plasma generation space between the upper electrode (the shower head 38) and the lower electrode (the mounting stage 12) to cause the principal surface of the wafer to be etched by radicals and ions in the plasma. The high-frequency power from the second high-frequency power source 32 can lead ions into the wafer.

After the plasma etching ends, the wafer W is lifted up by a lift pin and held. After the gate valve 30 is opened and the transfer arm is carried into the processing container 10, the lift pin is lowered and the wafer W is held by the transfer arm. Subsequently, the transfer arm goes out of the processing container 10, and the next wafer W is carried into the processing container 10 by the transfer arm. By repeating the process, the wafer W is repeatedly and continuously processed.

Figure 2:
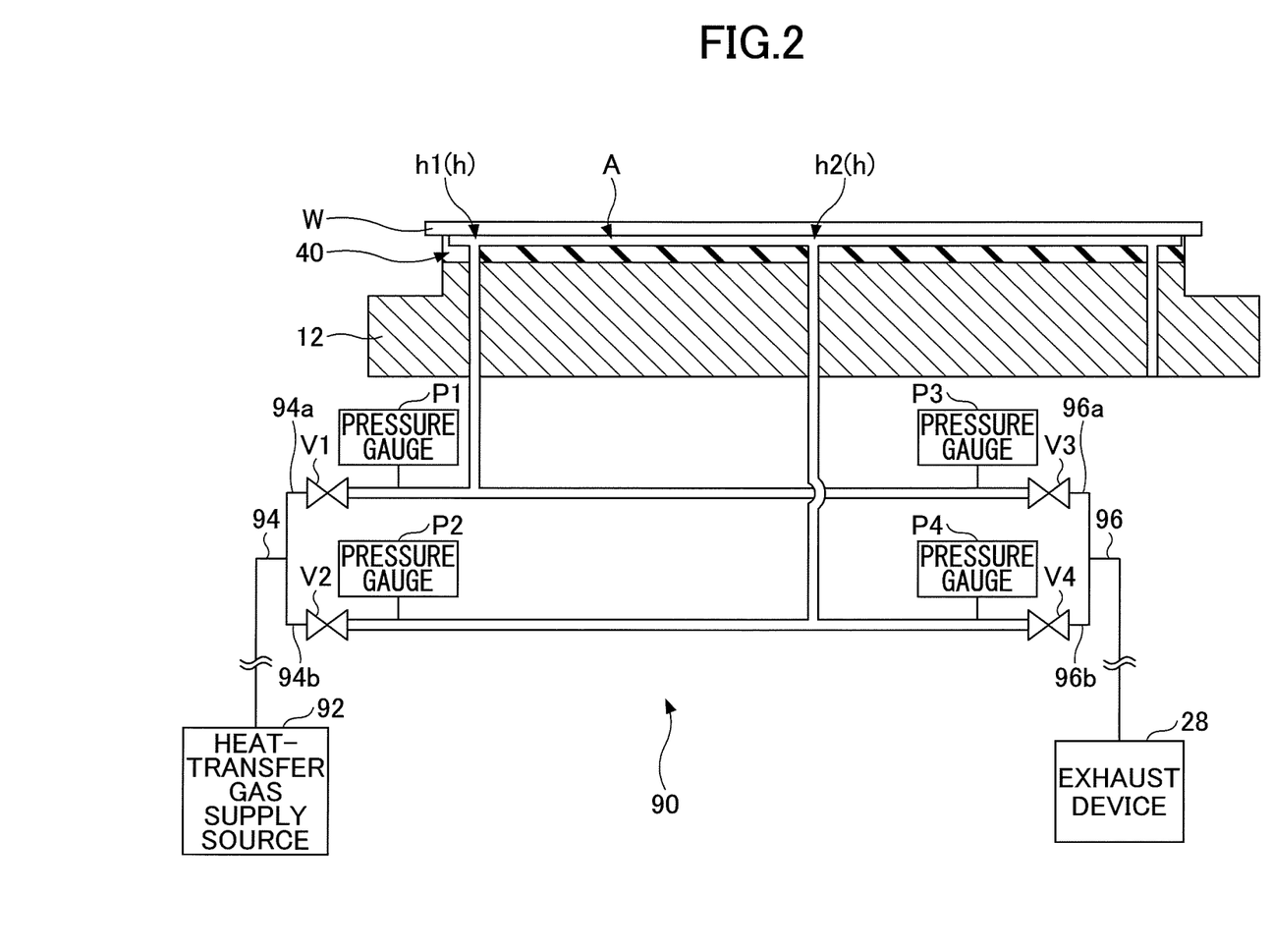
FIG. 2 illustrates a heat-transfer gas supply mechanism of a plasma processing apparatus according to the first embodiment.

Detailed heat-transfer gas supply mechanism 90 is described. FIG. 2 illustrates the heat-transfer gas supply mechanism of a plasma processing apparatus according to the first embodiment.

As illustrated in FIG. 2, the heat-transfer gas supply mechanism 90 includes a heat-transfer gas supply source 92, a heat-transfer gas supply line 94, and a heat-transfer gas exhaust line 96.

The heat-transfer gas supply source 92 supplies the heat-transfer gas such as He to the heat-transfer gas diffusion area A through the heat-transfer gas supply line 94. The heat-transfer gas diffusion area A is a circular recess formed on an upper surface of the electrostatic chuck 40, for example. The heat-transfer gas diffusion area A has multiple gas ports h ejecting the heat-transfer gas from the heat-transfer gas supply line 94. The gas port h1 is a gas port formed at a peripheral edge portion of the heat-transfer gas diffusion area A. The gas port h2 is formed in a central portion of the heat-transfer gas diffusion area A. When the wafer W adsorbs onto the upper surface of the electrostatic chuck 40, a supply space for supplying the heat-transfer gas is formed by the heat-transfer gas diffusion area A between the upper surface of the electrostatic chuck 40 and the back surface of the wafer W.

The heat-transfer gas supply line 94 is a gas line for supplying the heat-transfer gas that is supplied from the heat-transfer gas supply source 92 to the heat-transfer gas diffusion area A. One end of the heat-transfer gas supply line 94 is connected to the heat-transfer gas supply source 92, and the other end of the heat-transfer gas supply line 94 branches into multiple gas supply lines (for example, a first gas supply line 94a and a second gas supply line).

The first gas supply line 94a supplies the heat-transfer gas supplied from the heat-transfer gas supply source 92 through the gas port h1 to the peripheral edge portion of the heat-transfer gas diffusion area A. A control valve V1 and a pressure gauge P1 are interposed into the first gas supply line 94a from the upstream side. The opening degree of the control valve V1 is controlled so that pressure detected by the pressure gauge P1 becomes desired pressure. The pressure gauge P1 may be integral with the control valve V1.

The second gas supply line 94b supplies the heat-transfer gas supplied from the heat-transfer gas supply source 92 through the gas port h2 to the central portion of the heat-transfer gas diffusion area A. A control valve V2 and a pressure gauge P2 are interposed into the second gas supply line 94b from the upstream side. The opening degree of the control valve V2 is controlled so that pressure detected by the pressure gauge P2 becomes desired pressure. The pressure gauge P2 may be integral with the control valve V2.

The heat-transfer gas exhaust line 96 is a gas line for exhausting the heat-transfer gas supplied to the heat-transfer gas diffusion area A. One end of the heat-transfer gas exhaust line 96 is connected to the exhaust device 28, and the other end of the heat-transfer gas exhaust line 96 branches into multiple gas exhaust lines (for example, a first gas exhaust line 96a and a second gas exhaust line 96b). The heat-transfer gas exhaust line 96 is sufficient to be able to exhaust the heat-transfer gas supplied to the heat-transfer gas diffusion area A. For example, the one end of the heat-transfer gas exhaust line 96 may be connected to an exhaust device other than the exhaust device 28.

The first gas exhaust line 96a exhausts the heat-transfer gas supplied to the heat-transfer gas diffusion area A through the gas port h1. The first gas exhaust line 96a is connected to and interposes between the control valve V1 of the first gas supply line 94a and the gas port h1. A pressure gauge P3 and a control valve V3 are interposed into the first gas exhaust line 96a from the upstream side. The opening degree of the control valve V3 is controlled so that pressure detected by the pressure gauge P3 becomes desired pressure. The pressure gauge P3 may be integral with the control valve V3.

The second gas exhaust line 96b exhausts the heat-transfer gas supplied to the heat-transfer gas diffusion area A through the gas port h2. The second gas exhaust line 96b is connected to and interposes between the control valve V2 of the second gas supply line 94b and the gas port h2. A pressure gauge P4 and a control valve V4 are interposed into the second gas exhaust line 96b from the upstream side. The opening degree of the control valve V4 is controlled so that pressure detected by the pressure gauge P4 becomes desired pressure. The pressure gauge P4 may be integral with the control valve V4.

An example of the operation of the heat-transfer gas supply mechanism 90 is described next.

Figure 3A:
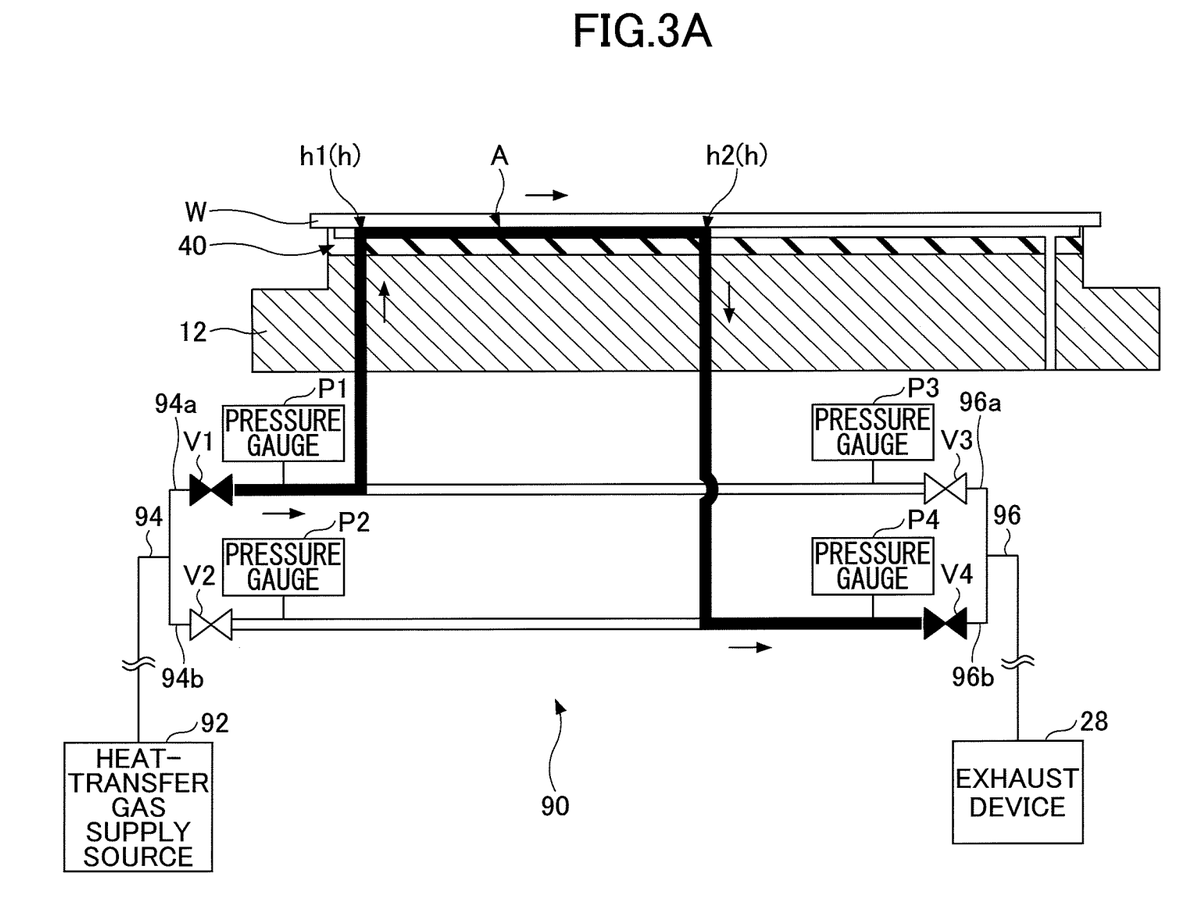
FIGS. 3A and 3B illustrate an operation of a heat-transfer gas supply mechanism illustrated in FIG. 2.
Figure 3B:
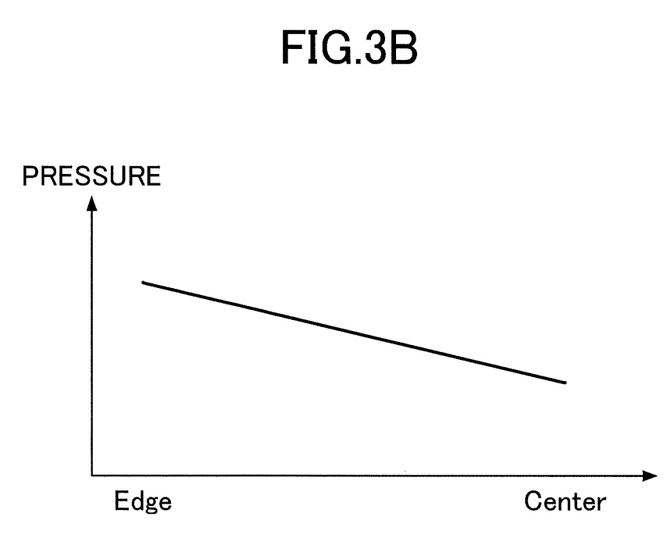

FIGS. 3A and 3B explain the operation of the heat-transfer gas supply mechanism 90 illustrated in FIG. 2. Referring to FIGS. 3A and 3B, the operation of the heat-transfer gas supply mechanism 90 is explained in a case where the pressure of the peripheral edge portion (Edge) of the heat-transfer gas diffusion area A is higher than the pressure of the central portion (Center) of the heat-transfer gas diffusion area A. FIG. 3A illustrates a flow of the heat-transfer gas. FIG. 3B illustrates a pressure distribution of the heat-transfer gas diffusion area A in a radial direction. In FIG. 3A, a state where the control valve is opened is indicated by the black color, a state where the control valve is closed is indicated by the white color, and a direction of flowing the heat-transfer gas is indicated by the arrows.

In a case where the pressure of the peripheral edge portion of the heat-transfer gas diffusion area A is made higher than the pressure of the central portion, as illustrated in FIG. 3A, the control valves V1 and V4 are opened, and the control valves V2 and V3 are closed. With this, the heat-transfer gas supplied from the heat-transfer gas supply source 92 is supplied to the heat-transfer gas diffusion area A through the first gas supply line 94a and the gas port h1. The heat-transfer gas supplied to the heat-transfer gas diffusion area A is exhausted through the gas port h2 and the second gas exhaust line 96b by the exhaust device 28. At this time, as illustrated in FIG. 3B, the pressure of the peripheral edge portion of the heat-transfer gas diffusion area A becomes higher than the pressure of the central portion of the heat-transfer gas diffusion area A by a pressure loss caused when the heat-transfer gas passes through a narrow space between the upper surface of the electrostatic chuck 40 and the back surface of the wafer W. With this, heat transfer at the peripheral edge portion of the wafer W between the electrostatic chuck 40 and the wafer W can be further promoted than heat transfer at the central portion of the wafer W between the electrostatic chuck 40 and the wafer W. Further, it is possible to form a flow of the heat-transfer gas from the peripheral edge portion to the central portion in the horizontal direction within the heat-transfer gas diffusion area A. Therefore, a smooth pressure gradient can be implemented by a flow resistance. Further, the open degrees of the control valves V1 and V4 are adjusted and the flow rate of the heat-transfer gas flowing through the heat-transfer gas diffusion area A is controlled so as to freely control the pressure gradient.

Figure 4A:
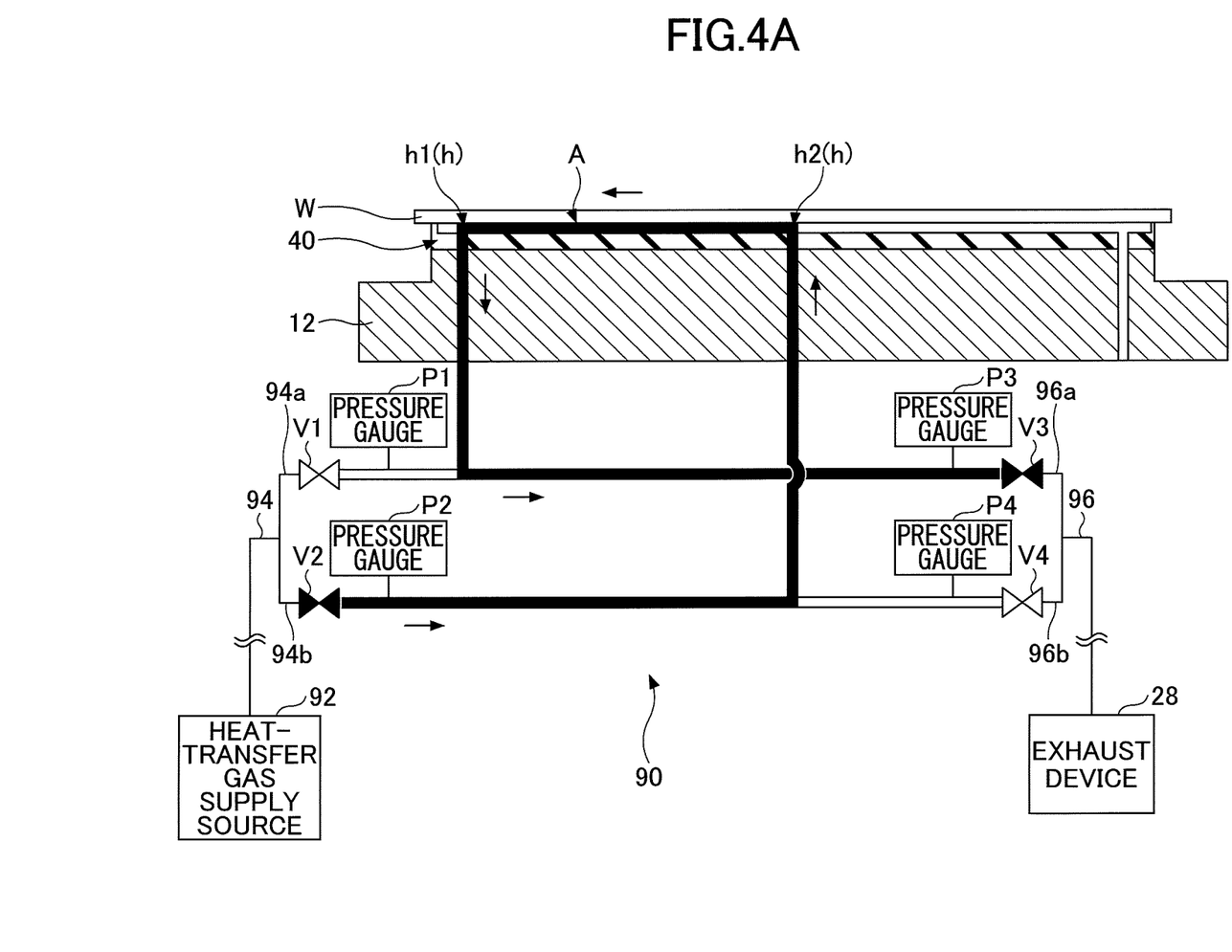
FIGS. 4A and 4B illustrate an operation of a heat-transfer gas supply mechanism illustrated in FIG. 2.
Figure 4B:
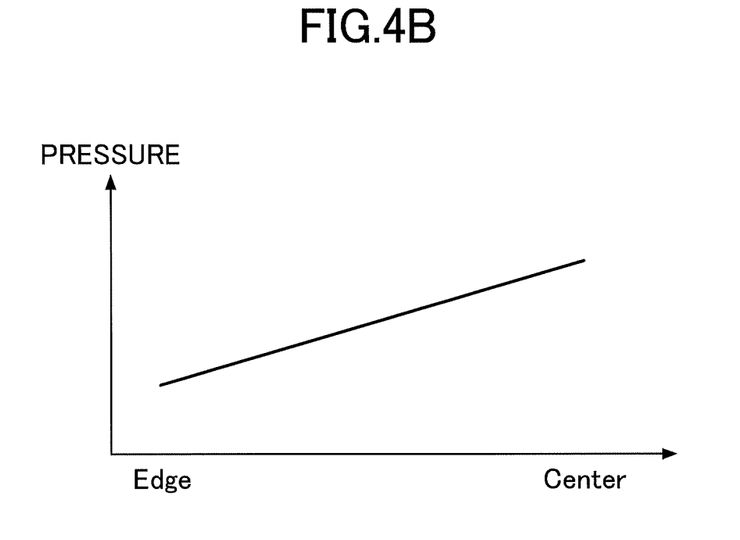

FIGS. 4A and 4B explain the operation of the heat-transfer gas supply mechanism 90 illustrated in FIG. 2. Referring to FIGS. 4A and 4B, the operation of the heat-transfer gas supply mechanism 90 is explained in a case where the pressure of the central portion (Center) of the heat-transfer gas diffusion area A is higher than the pressure of the peripheral edge portion (Edge) of the heat-transfer gas diffusion area A. FIG. 4A illustrates a flow of the heat-transfer gas. FIG. 4B illustrates a pressure distribution of the heat-transfer gas diffusion area A in a radial direction. In FIG. 4A, a state where the control valve is opened is indicated by the black color, a state where the control valve is closed is indicated by the white color, and a direction of flowing the heat-transfer gas is indicated by the arrows.

In a case where the pressure of the central portion of the heat-transfer gas diffusion area A is made higher than the pressure of the peripheral edge portion, as illustrated in FIG. 4A, the control valves V2 and V3 are opened, and the control valves V1 and V4 are closed. With this, the heat-transfer gas supplied from the heat-transfer gas supply source 92 is supplied to the heat-transfer gas diffusion area A through the second gas supply line 94b and the gas port h2. The heat-transfer gas supplied to the heat-transfer gas diffusion area A is exhausted through the gas port h1 and the first gas exhaust line 96b by the exhaust device 28. At this time, as illustrated in FIG. 4B, the pressure of the central portion of the heat-transfer gas diffusion area A becomes higher than the pressure of the peripheral edge portion of the heat-transfer gas diffusion area A by a pressure loss caused when the heat-transfer gas passes through a narrow space between the upper surface of the electrostatic chuck 40 and the back surface of the wafer W. With this, heat transfer at the peripheral edge portion of the wafer W between the electrostatic chuck 40 and the wafer W can be further promoted than heat transfer at the central portion of the wafer W between the electrostatic chuck 40 and the wafer W. Further, it is possible to form a flow of the heat-transfer gas from the central portion to the peripheral edge portion in the horizontal direction within the heat-transfer gas diffusion area A. Therefore, a smooth pressure gradient can be implemented by a flow resistance. Further, the open degrees of the control valves V2 and V3 are adjusted and the flow rate of the heat-transfer gas flowing through the heat-transfer gas diffusion area A is controlled so as to freely control the pressure gradient.

Next, an example of controlling the temperature of the wafer W mounted on the mounting stage 12 using the heat-transfer gas supply mechanism 90 is described.

At first, the control valves V1 and V4 are opened and the control valves V2 and V3 are closed. By this, the heat-transfer gas is supplied between the wafer W and the mounting stage 12 (to the heat-transfer gas diffusion area A) from the gas port h1 provided in the mounting stage 12, and the heat-transfer gas is exhausted from the gas port h2.

Subsequently, the pressure of the gas port h1 on a side of supplying the heat-transfer gas using the pressure gauge P1, and the pressure of the gas port h2 on a side of exhausting the heat-transfer gas using the pressure gauge P4. Moreover, a pressure difference between the gas port h1 on a side of supplying the heat-transfer gas and the gas port h2 on a side of exhausting the heat-transfer gas may be calculated depending on the pressure detected by the pressure gauge P1 and the pressure detected by the pressure gauge P4.

Subsequently, the open degrees of the control valves V1 and V4 are adjusted so that the detected pressure becomes the pressure predetermined by the recipe or the like. In a case where the pressure difference is calculated, the open degrees of the control valves V1 and V4 may be adjusted so that the detected pressure difference becomes the pressure difference predetermined by the recipe or the like.

With these processes, the pressure distribution on the surface of the heat-transfer gas diffusion area A can be adjusted to be desired pressure distribution, and the heat transfer amount between the electrostatic chuck 40 and the wafer W on the surface of the wafer W can be controlled. With this, controllability of the temperature distribution on the surface of the wafer W mounted on the mounting stage 12 can be enhanced. Further, it is possible to form a flow of the heat-transfer gas in the horizontal direction within the heat-transfer gas diffusion area A. Therefore, a smooth pressure gradient can be implemented by the flow resistance.

Figure 5:
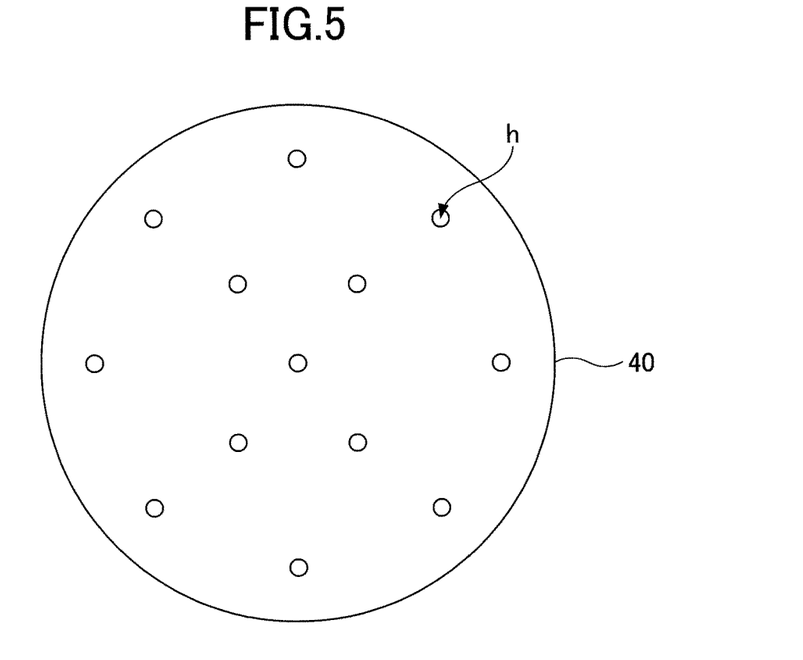
FIG. 5 illustrates an example (1) of arrangement of gas ports for supplying heat-transfer gas to a heat-transfer gas diffusion area.
Figure 6:
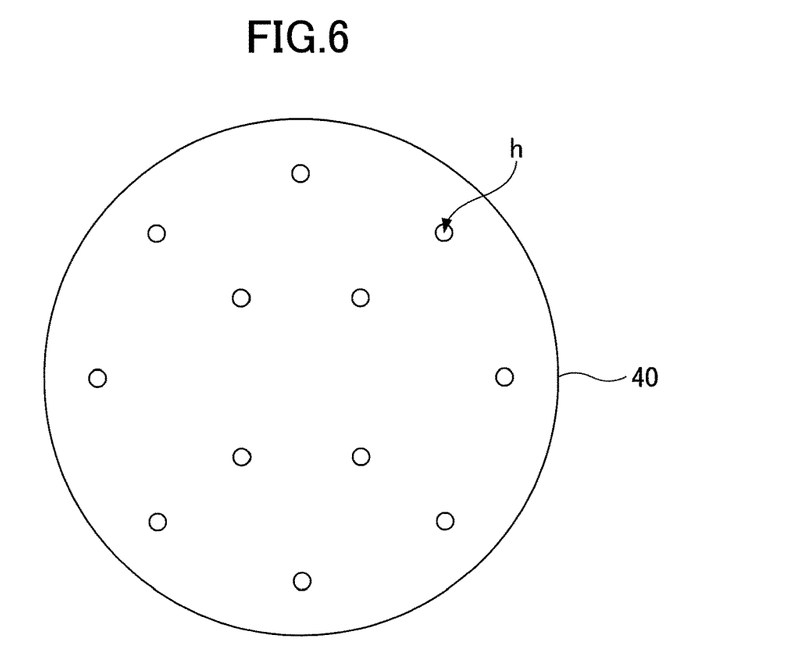
FIG. 6 illustrates an example (2) of arrangement of gas ports for supplying heat-transfer gas to a heat-transfer gas diffusion area.

For convenience of the explanation, referring to FIGS. 2 to 4, described is the case where the flow of the heat-transfer gas is controlled by switching over supply and exhaust of the heat-transfer gas for the two gas ports h1 and h2 formed in the heat-transfer gas diffusion area A. However, the embodiment is not limited thereto. For example, as illustrated in FIGS. 5-6, a large number of gas ports h may be arranged within the heat-transfer gas diffusion area A in a shape of a concentric circle or a sector or a shape of a combination of the concentric circle or the sector in a plan view. In this case, the heat-transfer gas is supplied from at least any one gas port h from among the large number of the gas ports to the heat-transfer gas diffusion area A, and the heat-transfer gas may be exhausted from another gas port h. FIGS. 5 and 6 illustrate examples of arrangement of gas ports for supplying the heat-transfer gas to the heat-transfer gas diffusion area.

As described above, within the first embodiment, the flow of the heat-transfer gas is formed in the horizontal direction within the heat-transfer gas diffusion area A, and the pressure of the flow on the upstream side and the downstream side is adjusted so as to control a heat transfer amount from the electrostatic chuck 40 to the wafer W on the surface of the wafer W. With this, controllability of the temperature distribution on the surface of the wafer W mounted on the mounting stage 12 can be enhanced.

[Second Embodiment]

Figure 7:
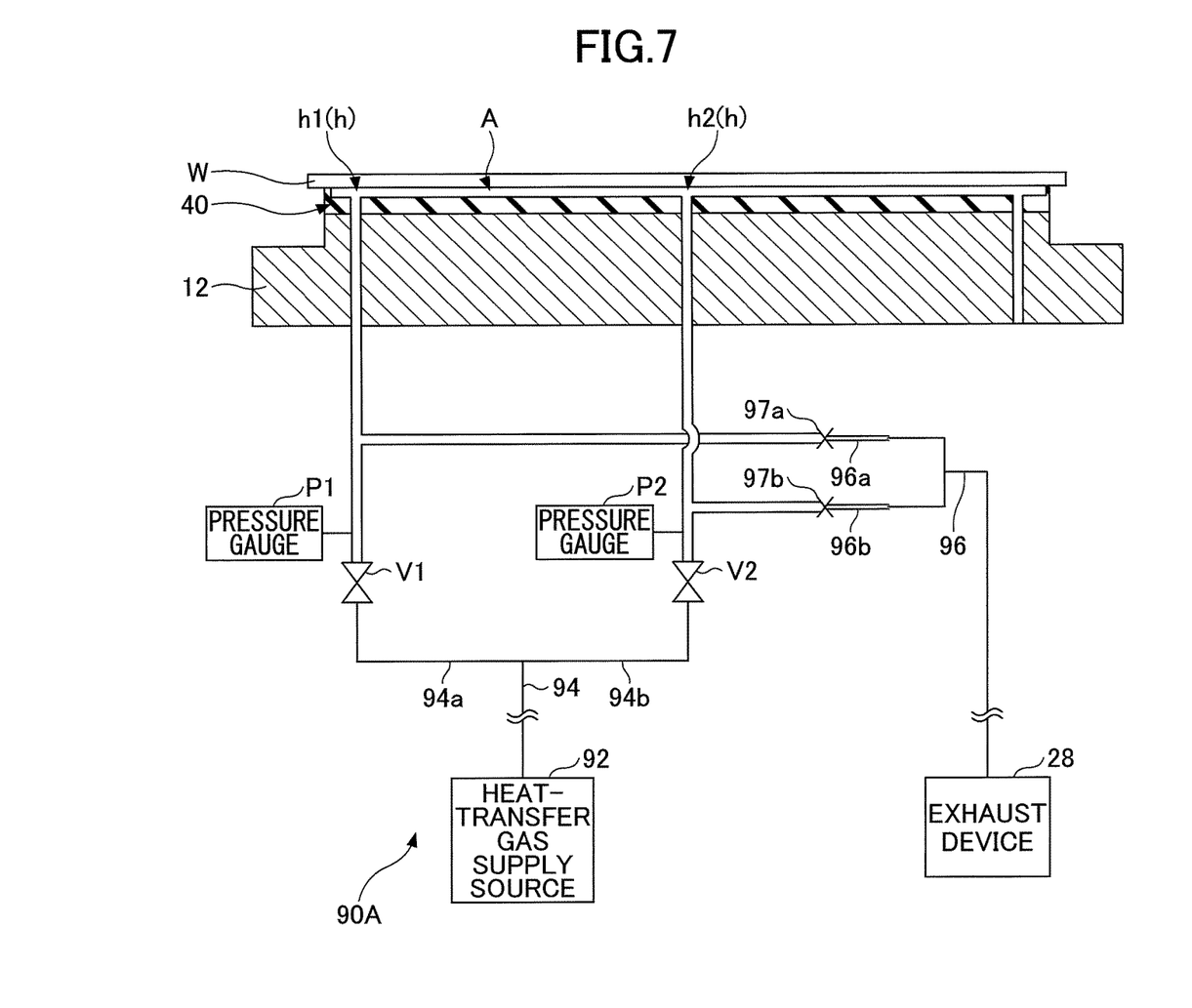
FIG. 7 illustrates a heat-transfer gas supply mechanism of a plasma processing apparatus according to the second embodiment.

Described is a plasma processing apparatus according to a second embodiment. The plasma processing apparatus of the second embodiment differs from the plasma processing apparatus of the first embodiment at a point that an orifice 97a and an orifice 97b are respectively interposed into the first gas exhaust line 96a and the second gas exhaust line 97b. The other structures are similar to the first embodiment and an explanation of the other structures are omitted. FIG. 7 illustrates the heat-transfer gas supply mechanism of the plasma processing apparatus according to the second embodiment.

As illustrated in FIG. 7, a heat-transfer gas supply mechanism 90A includes a heat-transfer gas supply source 92, a heat-transfer gas supply line 94, and a heat-transfer gas exhaust line 96.

The heat-transfer gas supply source 92 supplies the heat-transfer gas such as He to a heat-transfer gas diffusion area A through the heat-transfer gas supply line 94. The heat-transfer gas diffusion area A is a circular recess formed on an upper surface of the electrostatic chuck 40, for example. The heat-transfer gas diffusion area A has multiple gas ports h ejecting the heat-transfer gas from the heat-transfer gas supply line 94. The gas port h1 is a gas port formed at a peripheral edge portion of the heat-transfer gas diffusion area A. The gas port h2 is formed in a central portion of the heat-transfer gas diffusion area A. When the wafer W adsorbs onto the upper surface of the electrostatic chuck 40, a supply space for supplying the heat-transfer gas is formed by the heat-transfer gas diffusion area A between the upper surface of the electrostatic chuck 40 and the back surface of the wafer W.

The heat-transfer gas supply line 94 is a gas line for supplying the heat-transfer gas that is supplied from the heat-transfer gas supply source 92 to the heat-transfer gas diffusion area A. One end of the heat-transfer gas supply line 94 is connected to the heat-transfer gas supply source 92, and the other end of the heat-transfer gas supply line 94 branches into multiple gas supply lines (for example, a first gas supply line 94a and a second gas supply line).

The first gas supply line 94a supplies the heat-transfer gas, which is supplied from the heat-transfer gas supply source 92, through the gas port h1 to the peripheral edge portion of the heat-transfer gas diffusion area A. A control valve V1 and a pressure gauge P1 are interposed into the first gas supply line 94a. The opening degree of the control valve V1 is controlled so that pressure detected by the pressure gauge P1 becomes desired pressure. The pressure gauge P1 may be integral with the control valve V1.

The second gas supply line 94b supplies the heat-transfer gas supplied from the heat-transfer gas supply source 92 through the gas port h2 to the central portion of the heat-transfer gas diffusion area A. A control valve V2 and a pressure gauge P2 are interposed into the second gas supply line 94b from the upstream side. The opening degree of the control valve V2 is controlled so that pressure detected by the pressure gauge P2 becomes desired pressure. The pressure gauge P2 may be integral with the control valve V2.

The heat-transfer gas exhaust line 96 is a gas line for exhausting the heat-transfer gas supplied to the heat-transfer gas diffusion area A. One end of the heat-transfer gas exhaust line 96 is connected to the exhaust device 28, and the other end of the heat-transfer gas exhaust line 96 branches into multiple gas exhaust lines (for example, the first gas exhaust line 96a and the second gas exhaust line 96b). The heat-transfer gas exhaust line 96 is sufficient to be able to exhaust the heat-transfer gas supplied to the heat-transfer gas diffusion area A. For example, the one end of the heat-transfer gas exhaust line 96 may be connected to an exhaust device other than the exhaust device 28.

The first gas exhaust line 96a exhausts the heat-transfer gas supplied to the heat-transfer gas diffusion area A through the gas port h1. The first gas exhaust line 96a is connected to and interposes between the control valve V1 of the gas supply line 94a and the gas port h1. A choke mechanism such as an orifice causing a pressure difference to be generated before and after the first gas exhaust line 96a (the upstream side and the downstream side).

The second gas exhaust line 96b exhausts the heat-transfer gas supplied to the heat-transfer gas diffusion area A through the gas port h2. The second gas exhaust line 96b is connected to and interposes between the control valve V2 of the second gas supply line 94b and the gas port h2. A choke mechanism such as an orifice causing a pressure difference to be generated before and after the second gas exhaust line 96b (the upstream side and the downstream side).

An example of the operation of the heat-transfer gas supply mechanism 90 is described next.

Figure 8A:
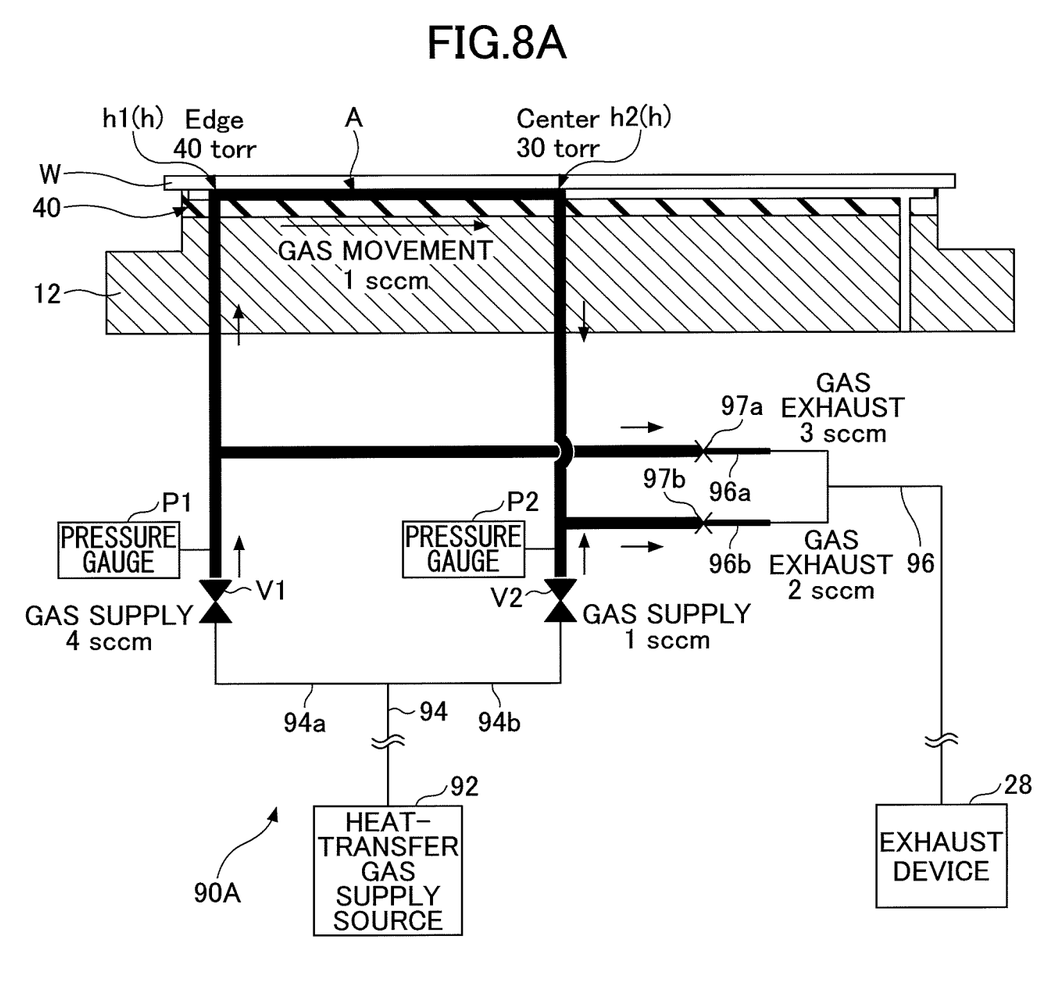
FIGS. 8A and 8B illustrate an operation (1) of the heat-transfer gas supply mechanism illustrated in FIG. 7.
Figure 8B:
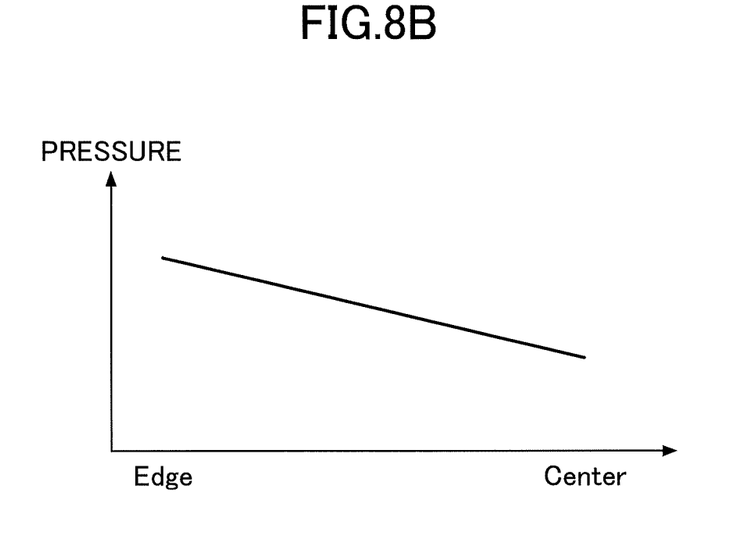

FIGS. 8A and 8B explain the operation of the heat-transfer gas supply mechanism 90A illustrated in FIG. 7. Referring to FIGS. 8A and 8B, the operation of the heat-transfer gas supply mechanism 90A is explained in a case where the pressure of the peripheral edge portion (Edge) of the heat-transfer gas diffusion area A is higher than the pressure of the central portion (Center) of the heat-transfer gas diffusion area A. FIG. 8A illustrates a flow of the heat-transfer gas. FIG. 8B illustrates a pressure distribution of the heat-transfer gas diffusion area A in a radial direction. In FIG. 8A, a state where the control valve is opened is indicated by the black color, a state where the control valve is closed is indicated by the white color, and a direction of flowing the heat-transfer gas is indicated by the arrows.

In a case where the pressure of the peripheral edge portion of the heat-transfer gas diffusion area A is made higher than the pressure of the central portion, for example, the open degree of the control valve V1 is made higher than the open degree of the control valve V2 so as to increase the flow rate of the heat-transfer gas flowing through the control valve V1 more than the flow rate of the heat-transfer gas flowing through the control valve V2. For example, as illustrated in FIG. 8A, the open degrees of the control valves V1 and V2 are controlled so that the heat-transfer gas of 4 sccm is supplied to the gas supply line 94a and the heat-transfer gas of 1 sccm is supplied to the gas supply line 94b. With this, the heat-transfer gas of 1 sccm from among the heat-transfer gas of 4 sccm, which is supplied to the first gas supply line 94a, is supplied to the heat-transfer gas diffusion area A. The heat-transfer gas of 3 sccm from among the heat-transfer gas of 4 sccm, which is supplied to the first gas supply line 94a, is exhausted through the first gas exhaust line 96a by the exhaust device 28. The heat-transfer gas of 1 sccm supplied to the heat-transfer gas diffusion area A flows into the second gas exhaust line 94b through the gas port h2. Together with the heat-transfer gas of 1 sccm supplied to the second gas supply line 96b, the heat-transfer gas of 1 sccm supplied to the heat-transfer gas diffusion area A is exhausted by the exhaust device 28. At this time, as illustrated in FIG. 8B, the pressure of the peripheral edge portion of the heat-transfer gas diffusion area A becomes higher than the pressure of the central portion of the heat-transfer gas diffusion area A as illustrated in FIG. 8B by a pressure loss caused when the heat-transfer gas passes through a narrow space between the upper surface of the electrostatic chuck 40 and the back surface of the wafer W. With this, heat transfer at the peripheral edge portion of the wafer W between the electrostatic chuck 40 and the wafer W can be further promoted than heat transfer at the central portion of the wafer W between the electrostatic chuck 40 and the wafer W. Further, it is possible to form a flow of the heat-transfer gas from the peripheral edge portion to the central portion in the horizontal direction within the heat-transfer gas diffusion area A. Therefore, a smooth pressure gradient can be implemented by a flow resistance. Further, the open degrees of the control valves V1 and V2 are adjusted and the flow rate of the heat-transfer gas flowing through the heat-transfer gas diffusion area A is controlled so as to freely control the pressure gradient.

Figure 9A:
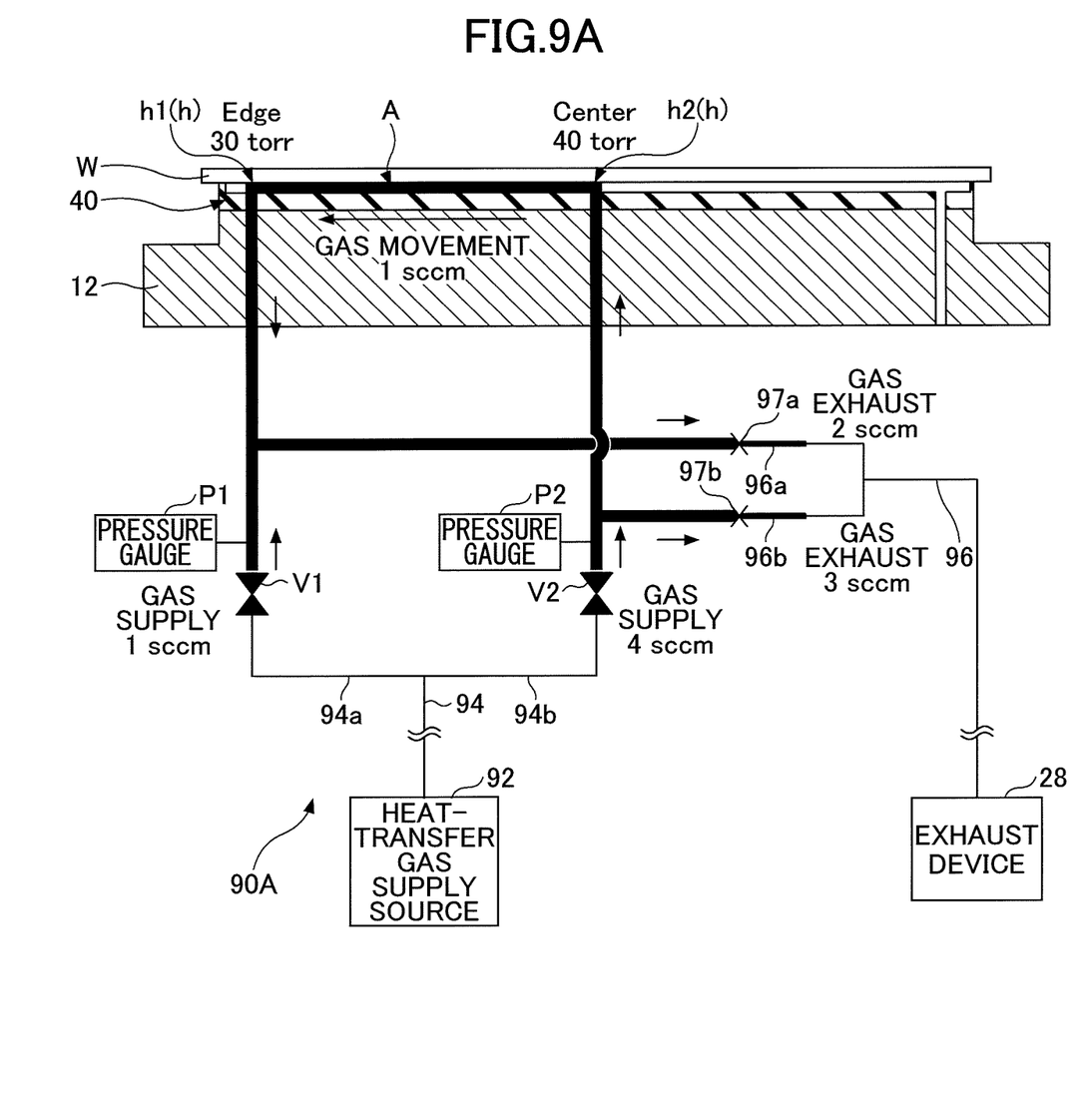
FIGS. 9A and 9B illustrate an operation (2) of the heat-transfer gas supply mechanism illustrated in FIG. 7.
Figure 9B:
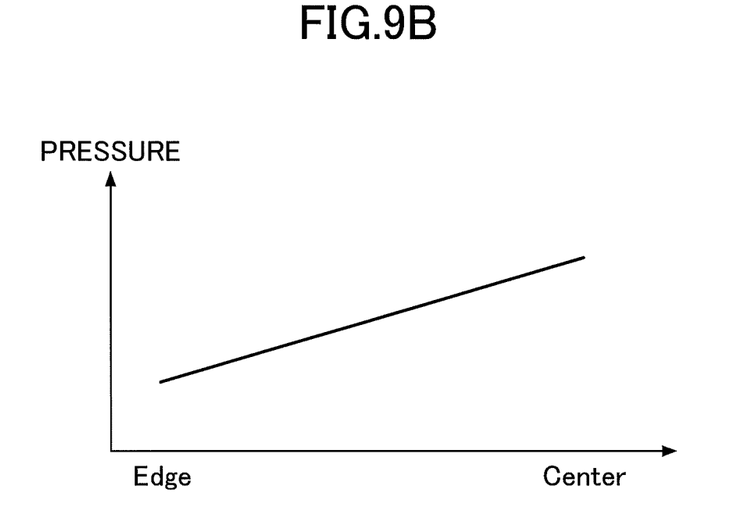

FIGS. 9A and 9B explain the operation of the heat-transfer gas supply mechanism 90A illustrated in FIG. 7. Referring to FIGS. 9A and 9B, the operation of the heat-transfer gas supply mechanism 90A is explained in a case where the pressure of the central portion (Center) of the heat-transfer gas diffusion area A is higher than the pressure of the peripheral edge portion (Edge) of the heat-transfer gas diffusion area A. FIG. 9A illustrates a flow of the heat-transfer gas. FIG. 9B illustrates a pressure distribution of the heat-transfer gas diffusion area A in a radial direction. In FIG. 9A, a state where the control valve is opened is indicated by the black color, a state where the control valve is closed is indicated by the white color, and a direction of flowing the heat-transfer gas is indicated by the arrows.

In a case where the pressure of the central portion of the heat-transfer gas diffusion area A is made higher than the pressure of the peripheral edge portion, for example, the open degree of the control valve V2 is made higher than the open degree of the control valve V1 so as to increase the flow rate of the heat-transfer gas flowing through the control valve V2 more than the flow rate of the heat-transfer gas flowing through the control valve V1. For example, as illustrated in FIG. 9A, the open degrees of the control valves V1 and V2 are controlled so that the heat-transfer gas of 1 sccm is supplied to the first gas supply line 94a, and the heat-transfer gas of 4 sccm is supplied to the second gas supply line 94b. With this, the heat-transfer gas of 1 sccm from among the heat-transfer gas of 4 sccm, which is supplied to the second gas supply line 94b, is supplied to the heat-transfer gas diffusion area A. The heat-transfer gas of 3 sccm from among the heat-transfer gas of 4 sccm, which is supplied to the gas supply line 94a, is exhausted through the second exhaust line 96b by the exhaust device 28. The heat-transfer gas of 1 sccm supplied to the heat-transfer gas diffusion area A flows into the first gas exhaust line 96a through the gas port h1. Together with the heat-transfer gas of 1 sccm supplied to the first gas supply line 94a, the heat-transfer gas of 1 sccm supplied to the heat-transfer gas diffusion area A is exhausted by the exhaust device 28. At this time, as illustrated in FIG. 9B, the pressure of the central portion of the heat-transfer gas diffusion area A becomes higher than the pressure of the peripheral edge portion of the heat-transfer gas diffusion area A by a pressure loss caused when the heat-transfer gas passes through a narrow space between the upper surface of the electrostatic chuck 40 and the back surface of the wafer W. With this, heat transfer at the central portion of the wafer W between the electrostatic chuck 40 and the wafer W can be further promoted than heat transfer at the peripheral edge portion of the wafer W between the electrostatic chuck 40 and the wafer W. Further, it is possible to form a flow of the heat-transfer gas from the central portion to the peripheral edge portion in the horizontal direction on the heat-transfer gas diffusion area A. Therefore, a smooth pressure gradient can be implemented by a flow resistance. Further, the open degrees of the control valves V1 and V2 are adjusted and the flow rate of the heat-transfer gas flowing through the heat-transfer gas diffusion area A is controlled so as to freely control the pressure gradient.

Next, an example of controlling the temperature of the wafer W mounted on the mounting stage 12 using the heat-transfer gas supply mechanism 90A is described.

At first, the open degree of the control valve V1 is adjusted so as to be higher than the open degree of the control valve V2. By this, the heat-transfer gas is supplied between the wafer W and the mounting stage 12 (to the heat-transfer gas diffusion area A) from the gas port h1 provided in the mounting stage 12, and the heat-transfer gas is exhausted from the gas port h2.

Subsequently, the pressure of the gas port h1 on a side of supplying the heat-transfer gas is detected using the pressure gauge P1, and the pressure of the gas port h2 on a side of exhausting the heat-transfer gas is detected using the pressure gauge P2. Moreover, a pressure difference between the gas port h1 on the side of supplying the heat-transfer gas and the gas port h2 on the side of exhausting the heat-transfer gas may be calculated depending on the pressure detected by the pressure gauge P1 and the pressure detected by the pressure gauge P2.

Subsequently, the open degrees of the control valves V1 and V2 are adjusted so that the detected pressure becomes the pressure predetermined by the recipe or the like. In a case where the pressure difference is calculated, the open degrees of the control valves V1 and V2 may be adjusted so that the detected pressure difference becomes the pressure difference predetermined by the recipe or the like.

With these processes, the pressure distribution on the surface of the heat-transfer gas diffusion area A can be adjusted to be desired pressure distribution, and the heat transfer amount between the electrostatic chuck 40 and the wafer W on the surface of the wafer W can be controlled. With this, controllability of the temperature distribution on the surface of the wafer W mounted on the mounting stage 12 can be enhanced. Further, it is possible to form a flow of the heat-transfer gas in the horizontal direction within the heat-transfer gas diffusion area A. Therefore, a smooth pressure gradient can be implemented by the flow resistance.

For convenience of the explanation, referring to FIGS. 7 to 9B, described is the case where the flow of the heat-transfer gas is controlled by switching over supply and exhaust of the heat-transfer gas for the two gas ports h1 and h2 formed in the heat-transfer gas diffusion area A. However, the embodiment is not limited thereto. For example, as illustrated in FIGS. 5-6, a large number of gas ports h may be arranged on the heat-transfer gas diffusion area A in a shape of a concentric circle or a sector or a shape of a combination of the concentric circle or the sector in a plan view. In this case, the heat-transfer gas is supplied from at least any one gas port h from among the large number of the gas ports to the heat-transfer gas diffusion area A, and the heat-transfer gas may be exhausted from another gas port h. FIGS. 5 and 6 illustrate examples of arrangement of gas ports for supplying the heat-transfer gas to the heat-transfer gas diffusion area.

As described above, within the second embodiment, the flow of the heat-transfer gas is formed in the horizontal direction within the heat-transfer gas diffusion area A, and the pressure of the flow on the upstream side and the downstream side is adjusted so as to control a heat transfer amount from the electrostatic chuck 40 to the wafer W on the surface of the wafer W. With this, controllability of the temperature distribution on the surface of the wafer W mounted on the mounting stage 12 can be enhanced.

Especially, within the second embodiment, the heat transfer amount of the surface of the wafer W from the electrostatic chuck 40 to the wafer W can be controlled by controlling only the control valves V1 and V2 respectively interposed into the first gas supply line 94a and the second gas supply line 94b. Therefore, a control of the heat transfer amount on the surface of the wafer W from the electrostatic chuck 40 to the wafer W is easier than in the first embodiment.

Especially, within the above embodiments, the control valves V1 and V2 are an example of a first control valve, and the control valves V3 and V4 are an example of a second control valve.

For example, the temperature control method of the present invention is applicable not only to a capacity-coupled type plasma (CCP: Capacitively Coupled Plasma) apparatus but also to another plasma processing apparatus. The other plasma processing apparatus is an inductively-coupled type plasma (ICP: Inductively Coupled Plasma), a plasma processing apparatus using a radial line slot antenna, a helicon wave excitation type plasma (HWP: Helicon Wave Plasma) apparatus, an electron cyclotron resonance plasma (ECR: Electron Cyclotron Resonance Plasma) apparatus, or the like.

All examples and conditional language recited herein are intended for pedagogical purposes to aid the reader in understanding the invention embodiments and the concepts contributed by the inventor to furthering the art, and are to be construed as being without limitation to such specifically recited examples and conditions, nor does the organization of such examples in the specification relate to a showing of superiority or inferiority of the invention embodiments. Although the temperature control method of the present invention has been described in detail, it should be understood that the various changes, substitutions, and alterations could be made hereto without departing from the spirit and scope of the invention.

According to the temperature control method, controllability of the temperature distribution on the surface of the substrate mounted on the mounting stage can be enhanced.

What is claimed is:

1. A temperature control method of controlling a temperature of an object to be processed, the temperature control method comprising:
   supplying a heat-transfer gas between an object to be processed and a mounting stage from a gas port from among a plurality of gas ports provided in a mounting stage;
   exhausting the heat-transfer gas from another gas port different from the gas port;
   detecting a pressure of the gas port supplying the heat-transfer gas and another pressure of the another gas port exhausting the heat-transfer gas; and
   adjusting the pressure and the another pressure.

2. The temperature control method according to claim 1, wherein the plurality of gas ports are arranged to have a shape of a concentric circle, a sector, or a combination of the concentric circle and the sector.

3. The temperature control method according to claim 1, wherein each of the plurality of gas ports is connected with a heat-transfer gas supply source and an exhaust device,
   wherein a first control valve for controlling a flow rate of the heat-transfer gas supplied to the gas port is interposed between the heat-transfer gas supply source and the gas port, and
   wherein a second control valve for controlling a flow rate of the heat-transfer gas exhausted from the another gas port is interposed between the exhaust device and the another gas port.

4. The temperature control method according to claim 3, wherein adjusting the pressure is performed by controlling both the first control valve and the second control valve.

5. The temperature control method according to claim 1, wherein each of the plurality of gas ports is connected with a heat-transfer gas supply source and an exhaust device,
   wherein a first control valve for controlling a flow rate of the heat-transfer gas supplied to the gas port is interposed between the heat-transfer gas supply source and the gas port, and
   wherein a choke mechanism is interposed between the exhaust device and the another gas port.

6. The temperature control method according to claim 5, wherein adjusting the pressure is performed by controlling the first control valve.

7. A temperature control method of controlling a temperature of an object to be processed mounted on a mounting stage, the temperature control method comprising:
   forming a flow of a heat-transfer gas in a horizontal direction between the object to be processed and the mounting stage;
   detecting a pressure of the heat-transfer gas on an upstream side and another pressure of the heat-transfer gas of a downstream side; and
   adjusting the pressure and the another pressure.

* * * * *